United States Patent
Malik et al.

(10) Patent No.: US 6,504,307 B1
(45) Date of Patent: Jan. 7, 2003

(54) APPLICATION OF VARIABLE BIAS VOLTAGE ON A CYLINDRICAL GRID ENCLOSING A TARGET

(75) Inventors: Shamim M. Malik, Madison, WI (US); Ty T. Hu, Mountain View, CA (US)

(73) Assignee: Advanced Cardiovascular Systems, Inc., Santa Clara, CA (US)

( * ) Notice: Subject to any disclaimer, the term of this patent is extended or adjusted under 35 U.S.C. 154(b) by 56 days.

(21) Appl. No.: 09/727,971

(22) Filed: Nov. 30, 2000

(51) Int. Cl.$^7$ .............................................. H05B 31/26
(52) U.S. Cl. ............................ 315/111.21; 315/111.81; 118/723 E
(58) Field of Search ....................... 315/111.21, 111.31, 315/111.41, 111.51, 111.61, 111.71; 118/723 E, 723 ER

(56) References Cited

U.S. PATENT DOCUMENTS

| | | | |
|---|---|---|---|
| 4,950,376 A | * 8/1990 | Hayashi et al. | 156/345 |
| 5,294,322 A | * 3/1994 | Vetter et al. | 204/192.38 |
| 5,336,518 A | 8/1994 | Narayanan et al. | 427/470 |
| 5,417,798 A | * 5/1995 | Nishibayashi et al. | 156/345 |
| 5,462,629 A | * 10/1995 | Kubota et al. | 156/345 |
| 5,777,438 A | * 7/1998 | Suzuki | 315/111.21 |
| 6,033,582 A | * 3/2000 | Lee et al. | 204/192.32 |

OTHER PUBLICATIONS

Felch, S.B., et al., "Comparison of Different Analytical Techniques In Measuring The Surface Region of Ultrashallow Doping Profiles," J. Va. Sci. Technol, vol. 14, No. 1 Jan./Feb. 1996, pp. 336–340.

Liebermann, Michael A., et al., "Principles of Plasma Discharges And Materials Processing," Wiley–Interscience Publication, John Wiley & Sons, Inc., pp. 526–539.

Scheuer, J. T., "Model of Plasma Source Ion Implantation In Planar, Cylindrical, And Spherical Geometries," J. Appl. Phys. vol. 67, No. 3, Feb. 1, 1990, pp. 1241–1245.

Malik, Shamim M., et al., "Development Of An Energetic Ion Assisted Mixing And Deposition for $TiN_x$ And Diamondlike Carbon Films, Using A Co–Axial Geometry In Plasma Source Ion Implantation," J. Vac. Sci. Technol., vol. 15, No. 6, Nov./Dec. 1997, pp. 2875–2879.

Malik, Shamim M., et al., "Measurement Of Electron Emission Due To Energetic Ion Bombardment In Plasma Source Ion Implantation," J. Appl. Phys. vol. 70, No. 9, Nov. 1, 1991, pp. 4756–4799.

Malik, Shamim M., et al., "Measurement of Spatial And Temporal Shealth Evolution For Spherical And Cylindrical Geometries in Plasma Source Ion Implantation," J. Appl. Phys. vol. 69, No. 5, Mar. 1, 1991, pp. 2904–2908.

Malik, Shamim M., et al., "Overview of Plasma Source Ion Implantation Research At University Of Wisconsin–Madison," J. Vac. Sci. Technol. vol. 12, No. 2, Mar./Apr. 1994, pp. 843–849.

Malik, Shamim M., et al., "Sheath Dynamics And Dose Analysis For Planar Targets In Plasma Source Ion Implantation," Plasma Sources Sci. Technol. vol. 2, 1993, pp. 81–85.

* cited by examiner

Primary Examiner—Don Wong
Assistant Examiner—Ephrem Alemu
(74) Attorney, Agent, or Firm—Blakely, Sokoloff, Taylor & Zafman LLP

(57) ABSTRACT

An apparatus and methods for modifying a surface of a target. The apparatus includes a reaction vessel having a reaction chamber. A cylindrical or spherical grid is positioned within the chamber. An electrode is also positioned within the chamber. A target can be positioned within the chamber and within the grid. A voltage source is operatively associated with the target and with the grid to separately but concurrently provide an independently variable voltage to both the grid and the electrode.

19 Claims, 4 Drawing Sheets

APPLICATION OF VARIABLE BIAS VOLTAGE ON A CYLINDRICAL GRID ENCLOSING A TARGET

FIELD OF THE INVENTION

The invention relates generally to the manufacture of medical devices and, more particularly, to an apparatus and a method for modifying a surface of a medical device designed for use or implantation within the body of a patient.

BACKGROUND OF THE INVENTION

In the semiconductor, industrial, electronics, and aerospace fields, conventional plasmas and plasma chambers implant, deposit, and/or mix various compounds and materials onto or into a surface or surfaces of planar targets such as silicon wafers, machine tools, or machine parts. These plasma coatings improve coefficients of friction, clean surfaces of various objects, and improve resistance to wear and corrosion.

In the biomedical field, ionized plasmas are used to harden housings of artificial joints and to manufacture intra-luminal devices such as stents and catheters. However, non-uniform implantation or deposition of atomic species associated with the cylindrical nature of intra-luminal devices creates problems. Surface defects, voids, and roughness, as well as leaching of chemicals can result from non-uniform implantation or deposition processes. Variations in a medical device's surface structure, such as bumps, trenches, or raw edges, can create potentially life-threatening situations by wearing or damaging the interior surfaces of vessels or vital organs. Wear or damage to vessels or vital organs can cause adhesions, influx of inflammatory cells, or overgrowth of tissue resulting in strictures, blockages, and restenosis, the narrowing of blood vessels. Non-uniform surfaces can cause proliferation of bacteria, formation of blood clots, disruption of blood flow, and/or calcification deposits. Leaching chemicals may cause toxic side effects or allergic reactions. Similarly, flaking or breakage resulting from non-uniform implantation may result in the deposition of potentially toxic materials throughout the body. For these reasons, it is desirable to manufacture implantable medical devices having biocompatible, chemically stable, and uniformly deposited surfaces.

Plasma ion implantation is preferred over conventional implantation methods because it provides a uniform ion dose and avoids many of the problems associated with shadowing and excessive sputtering. Of particular relevance to the biomedical field, plasma ion implantation has been shown to provide uniform doses of atom species on nonplanar targets without the necessity of manipulating those targets within the plasma chamber. Moreover, plasma ion implantation is desirable for use in medical applications because the implanted materials do not leach out, wash off, or become part of the blood stream.

Problems common in the art include non-uniform deposition or implantation of ions, especially where three dimensional target objects are concerned, and arcing, a luminous discharge of current typically associated with high voltages that can damage target objects.

The present invention provides a cylindrical plasma reaction chamber in which a cylindrical screen is coaxially positioned about a target. Concurrently biasing the screen and target with separate negative voltages not only increases the plasma density near the target area, resulting in a uniform deposition or implantation of ions, but also lessens the dangers associated with arcing, a luminous discharge of current typically associated with high voltages. Moreover, the cylindrical nature of the plasma reaction chamber and the screen allow uniform implantation of three-dimensional target objects.

SUMMARY OF THE INVENTION

A plasma ion surface modification apparatus is disclosed. The plasma ion surface modification apparatus includes a reaction vessel that has a base and a reaction chamber. An electrode is centrally positioned on the base within the chamber. A perforated grid is located within the chamber. The perforated grid encloses a target zone, and is coupled to a voltage source.

BRIEF DESCRIPTION OF THE DRAWINGS

The present invention is illustrated by way of example, and not limitation, in the figures of the acompanying drawings set forth below.

DETAILED DESCRIPTION OF THE INVENTION

As shown below in the detailed description and in the accompanying drawings, various embodiments of the present invention provide an apparatus and method substantially uniformly depositing plasma ions on or implanting and/or mixing plasma ions in a surface or surfaces of a two-dimensional or a three-dimensional target object.

In the present invention, described in detail below, a target is placed within a cylindrical plasma reaction chamber, which may be pressurized with high or low pressure, or not pressurized at all. High energy pulses applied by a high frequency energy source (a microwave or radio frequency emitter) to a gaseous medium introduced within the chamber, convert the gaseous medium to an ionized plasma. Simultaneously, negative voltage (typically about 10 KV to about 100 KV and about 10 pico seconds to about 50 pico seconds width at a frequency of about 100 HZ) applied to a surface or surfaces of the target object biases the target to attract plasma ions to it. Each voltage pulse repels electrons from the target on the timescale of the electron plasma frequency, which is short relative to the ion motion, and the repelled electrons leave behind an ion matrix sheath (plasma sheath) that expands into the plasma. The expanding sheath uncovers plasma ions, which accelerate and bombard the target from all sides simultaneously. This simultaneous three-dimensional bombardment achieves a uniform implantation or deposition of ions without having to manipulate the target object within the plasma field.

Figure 1:
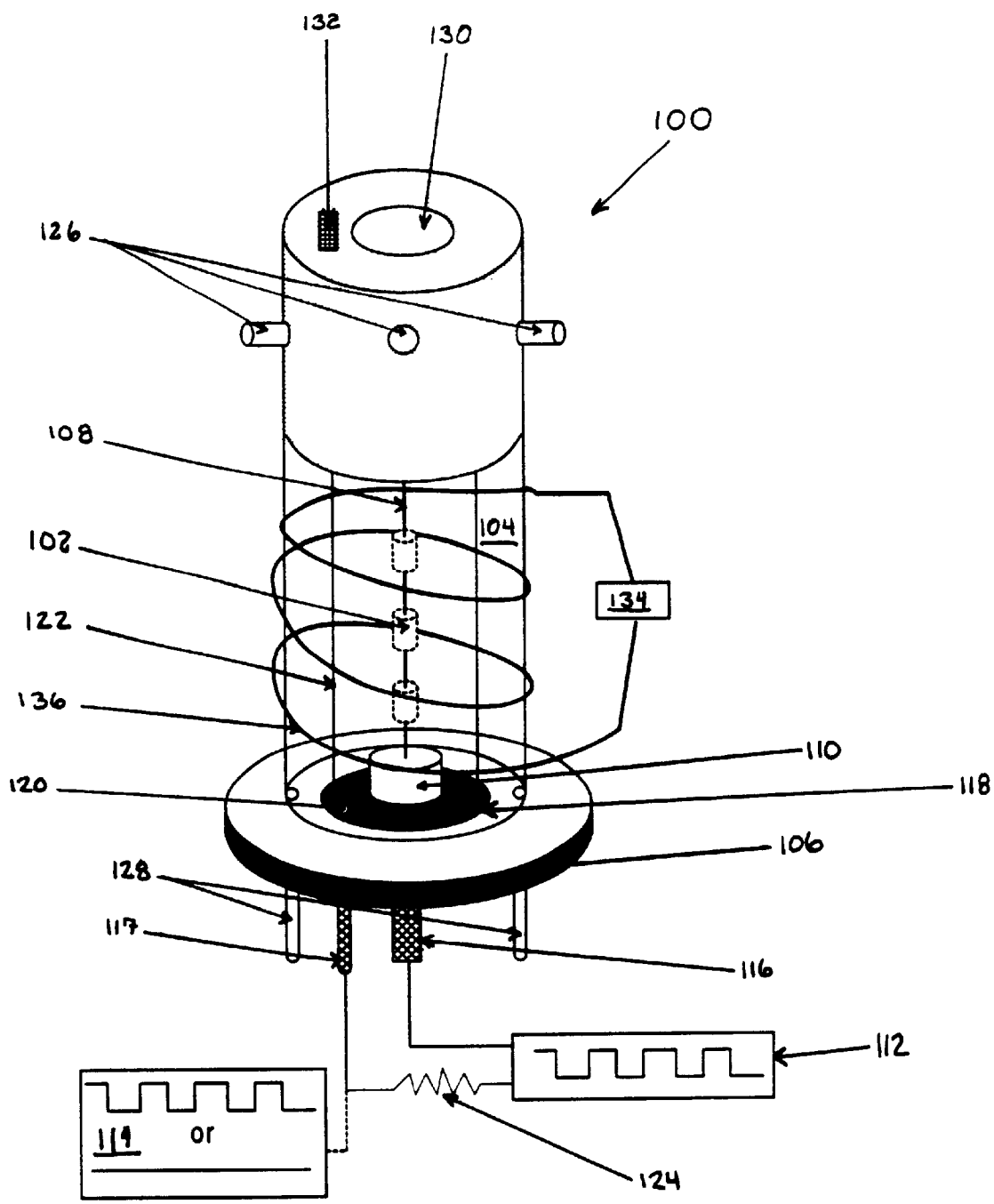
FIG. 1 is a perspective view of an ion implantation, deposition, and/or mixing chamber according to a preferred embodiment of the invention showing a schematic of independently variable bias.

FIG. 1 shows one embodiment of a plasma ion reaction vessel 100 used to implant, deposit, and/or mix various compounds and materials into or onto a surface or surfaces of a target 102. The interior and exterior geometries of vessel 100 are each preferably cylindrical, but other geometries may be used. For example, spherical. Vessel 100 may be fabricated of any number of suitable materials well known in the art, such as, but not limited to, stainless steel, glass, and aluminum. According to one embodiment of the invention, vessel 100 is made of stainless steel. In alternative embodiments, vessel 100 may comprise quartz or glass. In some embodiments, the interior walls of vessel 100 can be made from such illustrative materials as gold, aluminum, stainless steel, silicon, and titanium. In one embodiment, vessel 100 is approximately 4–15 inches in diameter and approximately 5–18 inches in height.

In various embodiments, fixed or removable liners (not shown) can be made of biocompatible materials such as stainless steel, glass, carbon, gold, and titanium. Vessel 100 may be fabricated to include multiple reaction chambers 104 for processing multiple batches of targets 102 independently or simultaneously. In one embodiment, chamber 104 is cylindrical and includes a base 106 made of stainless steel, a stainless steel alloy, or other suitable materials. FIG. 1 shows base 106 as a flat cylindrical disk whose diameter is larger than the diameter of chamber 104. In other embodiments, base 106 may be of any shape, such as square, oval, polygonal, or rectangular. The diameter of base 106 may approach or match the diameter of chamber 104.

Mandrel 108, illustratively shown in FIG. 1, holds a single target 102 or multiple targets 102 in a central position relative to the interior walls of reaction chamber 104. In one embodiment, mandrel 108 is an electrically conductive filament (wire) operatively coupled to an electrode 110, which is centrally located within chamber 104. Mandrel 108 may be fixed within chamber 104, but generally, mandrel 108 is removably positioned within chamber 104 in a substantially upright position as shown in FIG. 1. Alternatively, mandrel 108 can be removably positioned within chamber 104 in a substantially horizontal position. In one embodiment of the invention, one end of mandrel 108 is supported by and coupled to electrode 110 by a fastener (not shown) such as clip. Additionally, mandrel 108 may include various means for supporting a target or multiple targets within the central interior space of chamber 104. Such support means are designed to mount three-dimensional targets 102 such as stents and catheters in any position suitable for processing, and may include clips and other fasteners known in the art.

Conceivable forms of mandrel 108 used in some embodiments include, but are not limited to, a curved filament, a ladder, a lattice, a flexible filament, a spindle, a bar, a rod, an axle, a shaft, a hoop, or a wire. As used herein, the term "mandrel" encompasses the broadest possible scope to include at least any means of supporting a target 102 to electrode 110. In the particular context described, mandrel 108 electrically couples the target 102 to electrode 110.

In the described embodiment of FIG. 1, vessel 100 has one or more electrodes 110 centrally located within chamber 104. A first power source 112 electrically coupled to electrode 110 via electrical feedthrough port 116 pulses electrode 110 with negative voltage pulses, such as a square waveform. Electrode 110 may be fashioned of any suitable electrically conductive material, including, but not limited to, steel, copper, chromium, nickel, wolfram, iron, and similar materials. As shown in FIG. 1, electrode 110 may be tubular or cylindrical in shape.

Generally, electrode 110 is an electrical conductor capable of transmitting negative voltages in the approximate range of 100V to 100 KV. Electrode 110 may be positioned at a central location within chamber 104, as shown in FIG. 1, but any location within chamber 104 can be used. Coaxial positioning is generally used because it ensures that plasma ions bombard the target 102 from all directions in a radially uniform manner to implant or deposit a uniform radial ion dose across a target's surface(s). Alternatively, target 102 may be oriented at any position within chamber 104 needed to achieve a desired implantation or deposition. Mandrel 108 can be supported by electrode 110 as shown in FIG. 1 or can be supported by or suspended in the interior of chamber 104.

In one embodiment, an insulator 118 is centrally attached to base 106. As shown in FIG. 1, the diameter of insulator 118 is typically larger than the diameter of electrode 110 but smaller than the diameter of chamber 104. In some alternative embodiments, the diameter of insulator 118 may approach or equal that of base 106. Insulator 118 is formed of a non-electrically conductive material, including materials such as rubber, ceramic, or plastic. As shown in FIG. 1, insulator 118 includes a grid biasing connector 120. In alternative embodiments, grid connector 120 may be an annular conductor that is formed within the top surface of insulator 118 and electrically coupled to a voltage source 112. In one embodiment, grid biasing connector 120 may be the same diameter as conductive grid 122. In other embodiments, grid biasing connector 120 may be a clip or similar fastener attached to insulator 118. Grid connector 120 can be coupled to power source 112 and/or to power source 114 to bias grid 122 with a negative voltage. In one embodiment, grid connector 120 is biased with pulsed negative voltage. In another embodiment, grid connector 120 is biased with negative direct current (DC) voltage.

As shown in FIG. 1, grid 122 may be coaxially positioned within chamber 104 at any point within chamber 104 that allows for the deposition, implantation, and/or mixing of plasma ions. In one embodiment, grid 122 is positioned approximately the distance occupied by the width of about two (2) plasma (ion matrix) sheaths (about 1 to about 3 cm) away from electrode 110, and approximately the distance occupied by the width of about ten (10) plasma (ion matrix) sheaths (about 2 to about 50 cm) from the interior walls of chamber 104. If grid 122 deteriorates, corrodes, or suffers damages during processing, it may be replaced. Additionally, a grid 122 having different dimensions or comprising different materials may be substituted at any time before, during, or after processing.

In one embodiment, grid 122 may be perforated with holes up to about 0.25 inches in diameter, may be approximately 1/32 of an inch thick, and may be made of any electrically conductive material, for example, stainless steel or titanium.

In an embodiment of the present invention, a biasing voltage is concurrently applied to a target 102 (via electrode 110 and mandrel 108) and to grid 122. This voltage can be concurrently applied using a single voltage source 112 or multiple voltage sources 112 and 114. In one embodiment, the biasing voltage is fixed. However, in another embodiment, the biasing voltage is made variable and independently controllable so the first voltage applied to target 102 can be varied independently of a second voltage applied to grid 122. When properly adjusted, the biasing voltage applied to target 102 and to grid 122 protects target 102 from being damaged or destroyed by arcing, a problem typically associated with high voltages and well known in the electrical art.

Since arcing can damage a target 102, or at least inhibit uniform implantation or deposition, enclosing target 102 within a cylindrical grid 122, and biasing grid 122 with a voltage that is at least two voltage units lower than the voltage applied to target 102, ensures that target 102 is processed safely. The phrase "voltage units" means any unit for measuring voltage, including such units as Volts (V) and Kilo Volts (KV). For example, if target 102 were biased at about negative 100 V, the phrase "two voltage units lower than the voltage applied to target 102" would mean that grid 122 is biased at about negative 98 V or lower. If grid 122 were not provided, or were biased at a voltage higher than the voltage applied to targets 102, high voltage pulses would arc directly to target 102, especially if target 102 has sharp edges.

The difference in voltages applied to grid 122 and to target 102 creates a potential well that channels harmful arcs away from target 102 towards grid 122 or the interior walls of chamber 104, where they discharge safely. The potential difference between grid 122 and target 102 also generates a hollow cathode effect, which enhances the density of a plasma (not shown) formed within chamber 104. Increased plasma density ensures a more efficient and uniform ion implantation, deposition, and/or mixing process.

In the described embodiment, voltage source 112 generates a particular waveform, such as a square waveform, which provides an efficient and uniform ion bombardment. In other embodiments of the invention, a sinusoidal waveform may be used, but may be less effective than the square wave. Using a square waveform allows the ions to rapidly achieve a maximum energy level and to sustain it throughout most of the pulse width.

In the embodiment shown in FIG. 1, a single voltage source 112 can apply the biasing voltages to perforated grid 122 and target 102, as indicated by the dashed lines connecting voltage source 114 to electrical feed through port 117. Typically, the biasing voltage is made variable. Grid connector 120 can be coupled to voltage source 112 using a resistance (shown as resistor 124) of approximately 1 Kohm to 200 Kohms. In one embodiment, a first voltage applied to perforated grid 122 can be 50% to 99% lower than a second voltage applied to electrode 110. However, these ranges can be varied to have other values depending on the particular chamber configuration.

In one embodiment, a perforated grid 122 may both protect target 102 from arcing, and also sputter-deposit a desired material onto target 102. In such an embodiment, perforated grid 122 can be manufactured of the material to be sputter deposited, such as gold, stainless steel, titanium, or similar materials. In another embodiment, perforated grid 122 may be made of a base material and then coated with a material to be sputter deposited. Perforated grid 122 may include one or more perforations.

In one embodiment of the invention, sputter-depositing is accomplished by superimposing a direct current (DC) voltage of up to about 2000 V upon the pulsed biasing voltage applied to the perforated grid 122. The pulsed biasing voltage applied to grid 122 may be about 50% to 99% less than the biasing voltage simultaneously applied to target 102. The DC voltage strips metallic ions away from perforated grid 122, allowing them to mix with the plasma ions and to be deposited on target 102 where they may be implanted into or mixed with the target's surface material.

The value of the voltages applied to perforated grid 122 and target 102 determines whether ion implantation, deposition, and/or mixing occurs. To mix sputter-deposited material into a target surface matrix, negative voltages of approximately 5 to about 10 KV are applied to target 102. To implant ions approximately 0.3 to 0.4 microns inside the target 102 surface matrix, negative voltages of approximately 50 KV are applied to target 102. In many embodiments, the voltages applied to perforated grid 122 and target 102 approximately range from DC to pulsed energies having a frequency of about 5 kilohertz. In one embodiment, the range of pulses is approximately DC up to about 100 Hz. In another embodiment, the range of pulses is approximately 50 Hz to about 5 KHz. Typically, a shot of pulses is applied. Then a gap occurs. At about 5 KHz, the pulse and gap start meeting and there is not enough time for plasma (not shown) to approach target 102 and wait for the next pulse. Thus, about 5 kilohertz is typically the upper desirable frequency range.

In an alternative embodiment, electrode 110 and perforated grid 122 may be biased independently using separate voltage sources 112 and 114. In this embodiment, resistor 124 is not normally used. At least one voltage source supplies a square waveform to electrode 110 while another voltage source supplies voltage to grid 122. For example, voltage source 112 supplies a square waveform to electrode 110 while voltage source 114 supplies either a square waveform or DC voltage to perforated grid 122. The voltage supplied by source 114 can be synchronized with or overlap the voltage pulse generated by voltage source 112. Illustratively, if source 112 is pulsed at approximately 10 microseconds, voltage source 114 may be pulsed about 20 microseconds to provide an overlap of approximately 5 microseconds. In some embodiments, the applied voltage may have a pulse width of approximately 5 microseconds to about 200 microseconds at a frequency of DC to approximately 5 K Hz.

Gas ports 126 and aspiration ports 128 may be positioned at any suitable location in reaction vessel 100. In the described embodiment shown in FIG. 1, gas ports 126 are positioned in the top housing of vessel 100, while aspiration ports 128 are positioned at or near the base 106 of reaction chamber 104. Gas ports 126 are used to flux a first gaseous medium (in liquid or vapor form) into reaction chamber 104 where it is converted into an ionized plasma (not shown). Aspiration ports 128 are used after processing is complete, or when a new gas is desired, to pump the plasma formed from the first gaseous medium together with dirt, dust, and similar materials from the interior of chamber 104. Additionally, aspiration ports 128 may be used to adjust the atmospheric pressure within chamber 104 by pumping air into or out of chamber 104.

Whether implantation or deposition occurs depends, in part, on the air pressure within chamber 104 at the time of processing. For example, higher than ambient pressures are used for deposition because a higher internal pressure increases the plasma density, squeezing higher numbers of plasma ions within a given area. In a high pressure environment, ions accelerated toward target 102 lose most of their energy colliding with other ions on the way to the target 102, and come to rest on a surface(s) of target 102.

Lower than ambient internal air pressures facilitate implantation because ions accelerating toward target 102 collide with fewer plasma ions and retain most of their energy. Smashing into a target surface with near maximum energy allows the ions to implant into and/or beneath a target surface. In most embodiments, implantation occurs using pressures of approximately 0.1 to about 2.0 millitorr; deposition occurs using pressures of approximately 2.0 to about 100 millitorr, and plasma mediated cleaning occurs using pressures of approximately 2.0 to about 1000 millitorr, illustratively 2.0 to about 10.0 millitorr.

Alternative embodiments of vessel 100 include an ion gauge (not shown), a loading window 130, a screen feedthrough 132, and a baratron (not shown). Additionally, this and other embodiments generally include a plasma generating means. The plasma generating means can be a radio frequency source (not shown) and antenna (not shown), a microwave source (not shown), a glow discharge source (not shown), or an electron impact source (not shown). In all embodiments, the plasma generating means creates an ionized plasma from a gaseous medium introduced within chamber 104.

FIG. 1 shows how a radio frequency source 134 and antenna 136 can be used with vessel 100 to generate a plasma (not shown) within chamber 104. In one embodiment, antenna 136 is a radio-frequency conducting filament that is wrapped about chamber 104 in a helical or corkscrewed fashion as shown in FIG. 1. The corkscrew or helical shape places antenna 136 in a coaxial position relative to chamber 104 and target 102 such that target 102 is located within the center of the antenna's helical coil. This positioning provides a more uniform ion deposition, implantation, and/or mixing process than can be achieved using other plasma generating methods, such as the microwave energy and glow discharge methods. In one embodiment, energy source 134 provides approximately 2 KHz to approximately 28.3 GHz (or higher) of radio-frequency energy to convert a gaseous medium introduced within chamber 104 into an ionized plasma (not shown). Various embodiments of the invention are configured to provide a uniform ion dose. The phrase "uniform ion dose" means a uniform implantation or deposition of plasma ions on a target surface or surfaces of approximately $10^{12}$ to $5 \times 10^{18}$ ions/cm$^2$.

Figure 2:
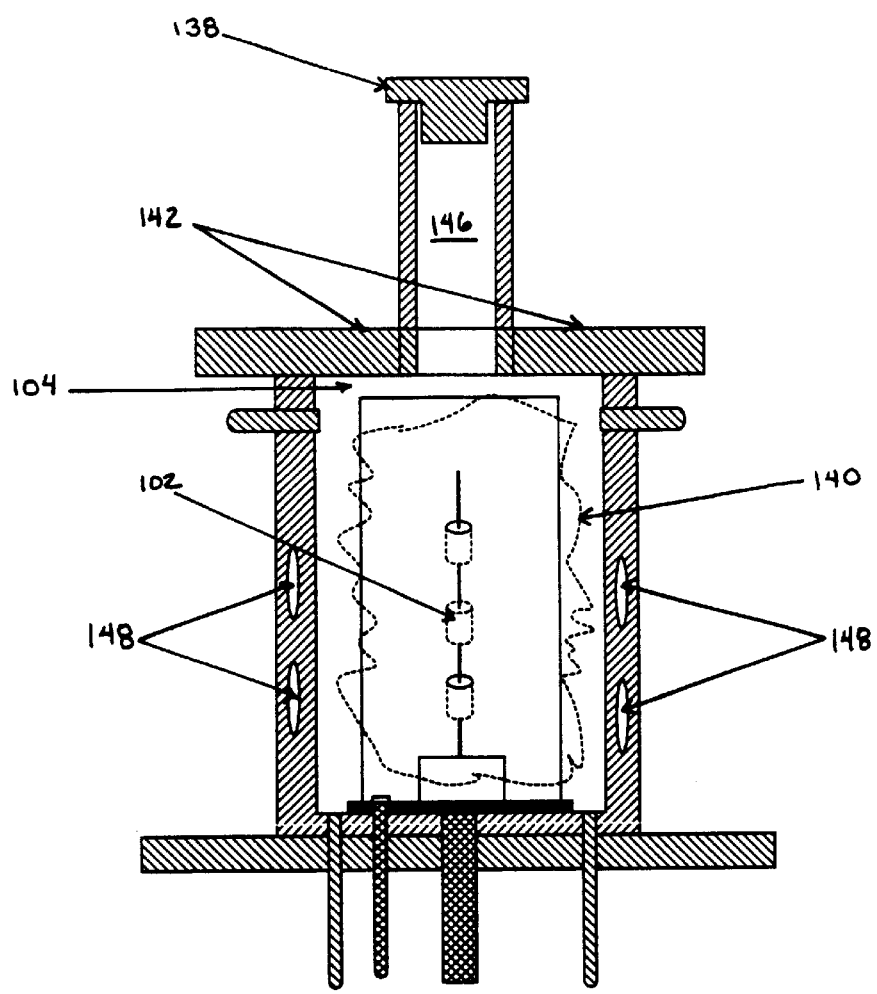
FIG. 2 is a cross-sectional view of an alternative illustrative embodiment of the plasma ion implantation, deposition, and/or mixing chamber showing an alternative plasma-generating source.

FIG. 2 shows a cross-sectional view of another embodiment of the present invention. In this embodiment, a microwave source 138 is used to generate an ionized plasma 140. A magnet 142 having an aperture centrally formed therein caps the top of chamber 104. In the embodiment of FIG. 2, the microwave source 138 is positioned above target 102 and/or, a target stage (not shown) at the top of channel 146, which rises from the aperture area in magnet 142. Microwave source 138 may be positioned at any suitable location to generated a plasma within chamber 104. In some embodiments, a digometry antenna or other suitable conductive material is associated with the walls of chamber 104. Microwave source 138 is generally capable of providing approximately 1 GHz to 3 GHz of microwave energy to the chamber to ionize a plasma 140. Some embodiments use a typical range of approximately 2.45 GHz to about 2.8 GHz.

Also shown in FIG. 2 is a set or sets of multi-dipole magnets 148. These magnets, incorporated within the chamber wall(s) are used to prevent plasma leakage. The magnets 148 positioned within the walls of chamber 104 are arranged in lanes having alternating north and south pole orientations such that the magnetic field lines originate from one lane and terminate into another. In other embodiments, the multi-dipole magnets 148 may be positioned inside or outside the walls of chamber 104, the geometry or which can be either rectangular or cylindrical. Magnets 142 and 148 create a strong magnetic field (typically about 50 G) through which plasma ions cannot pass. Plasma ions approaching the magnetic field are reflected back towards the interior of chamber 104 where they become available to bombard target 102.

In addition to using the radio-frequency or microwave methods described above, plasma may be generated within chamber 104 using the glow discharge method (not shown) or the electron impact method (not shown). In the glow discharge method, high negative voltage pulses are applied to an electrode (not shown) positioned within a reaction chamber (not shown) and immersed in a high neutral gas pressure (approximately 1 to 50 millitorr) to ionize the atoms of a gaseous medium introduced within the chamber into a plasma. Similarly, in the electron impact method, a set of tungsten filaments (not shown) located within a reaction chamber (not shown) is heated to emit electrons thermo-ionically. The filaments can be biased to approximately –146 V, which leads to the injection of hot primary electrons into the chamber. The energetic primary electrons are reflected back and forth from the dipole magnetic field cusp lines (not shown). During this process, the primary electrons collide with the gas atoms and strip atomic electrons from the gaseous medium, resulting in an ionized plasma.

The embodiments depicted in FIGS. 1 and 2 together with other embodiments of the invention can also be used for plasma mediated cleaning. To clean a target 102 positioned within the chamber, or to clean the chamber itself, a gaseous medium is introduced into chamber 104 under pressures in the appropriate range of about 10 millitorr to about 1000 millitorr. The medium is pulsed with high energy to form a plasma. To clean a target, negative voltage pulses in the approximate range of about 1 KV to about 10 KV are applied to the target. To clean the chamber, negative voltage pulses in the approximate range of about 1 KV to about 10 KV are applied to the chamber walls. Plasma ions attracted to target 102 or to the walls of chamber 104 chemically react with materials coating the target or wall surface (or surfaces) and volatize the materials. At the end of processing, these volatized materials are aspirated from chamber 104. Examples of gaseous media suitable for cleaning include: argon, chlorine, oxygen, fluorine, nitrogen tetra fluoride, and other suitable media. Phosphine (P3) is an example of a source gas (or liquid) that can be used for implantation of P32 for medical applications, including stents. In other embodiments, gaseous media or liquids such as nitrogen, and gaseous media or liquids similar to phosphine can be used for plasma ion implantation and deposition. In some embodiments, nitrogen can be used as a carrier gas for liquid sources. In some embodiments, nitrogen can be used to modify the tri-biological properties of medical devices, including radioactive and non-radioactive stents.

In some embodiments, tin (Sn-123) can be used as a radioactive source for treatment of restenosis and other radio-therapy applications, including stents loaded with Sn-123. Advantages of using Sn-123 include radiation energies appropriate for medical treatment, and a longer shelf life than P-32. In some embodiments, potassium (K40) can be used for treatment of restenosis and other radio-therapy applications, including stents loaded with K-40. Advantages of using K-40 are a long shelf life, radiation energies appropriate for medical applications, and that K-40 is a natural part of a human body.

Figure 3:
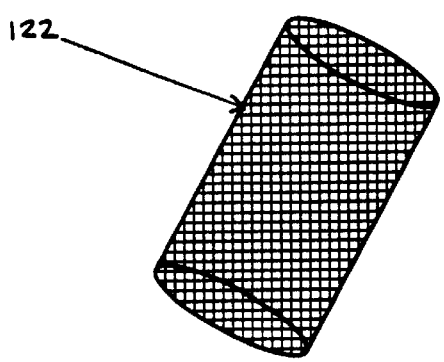
FIG. 3 is a perspective view of an embodiment of a perforated grid.

FIG. 3 shows an embodiment for perforated grid 122. In one embodiment, grid 122 is generally cylindrically shaped. In the shown embodiment, perforated grid 122 is a perforated cylinder measuring approximately 0.5 inches to 3.0 inches in diameter and approximately 2 inches to 1 foot in height. Perforated grid 122 may be positioned within chamber 104 coaxially about electrode 110, mandrel 108, and target 102 as shown in all Figures. In one embodiment, perforated grid 122 is an electrical conductor, which can be constructed from: copper, stainless steel, aluminum, wolfram, tantalum or other suitable materials. In one embodiment, perforated grid 122 is electrically transparent.

Electrically transparent means that approximately 50% to 90% of energies such as radio waves, direct current pulses, and microwave transmissions penetrate grid 122 to reach a target (not shown). In an alternative embodiment, perforated grid 122 may be a non-biocompatible electrical conductor coated with a biocompatible material.

Figure 4:
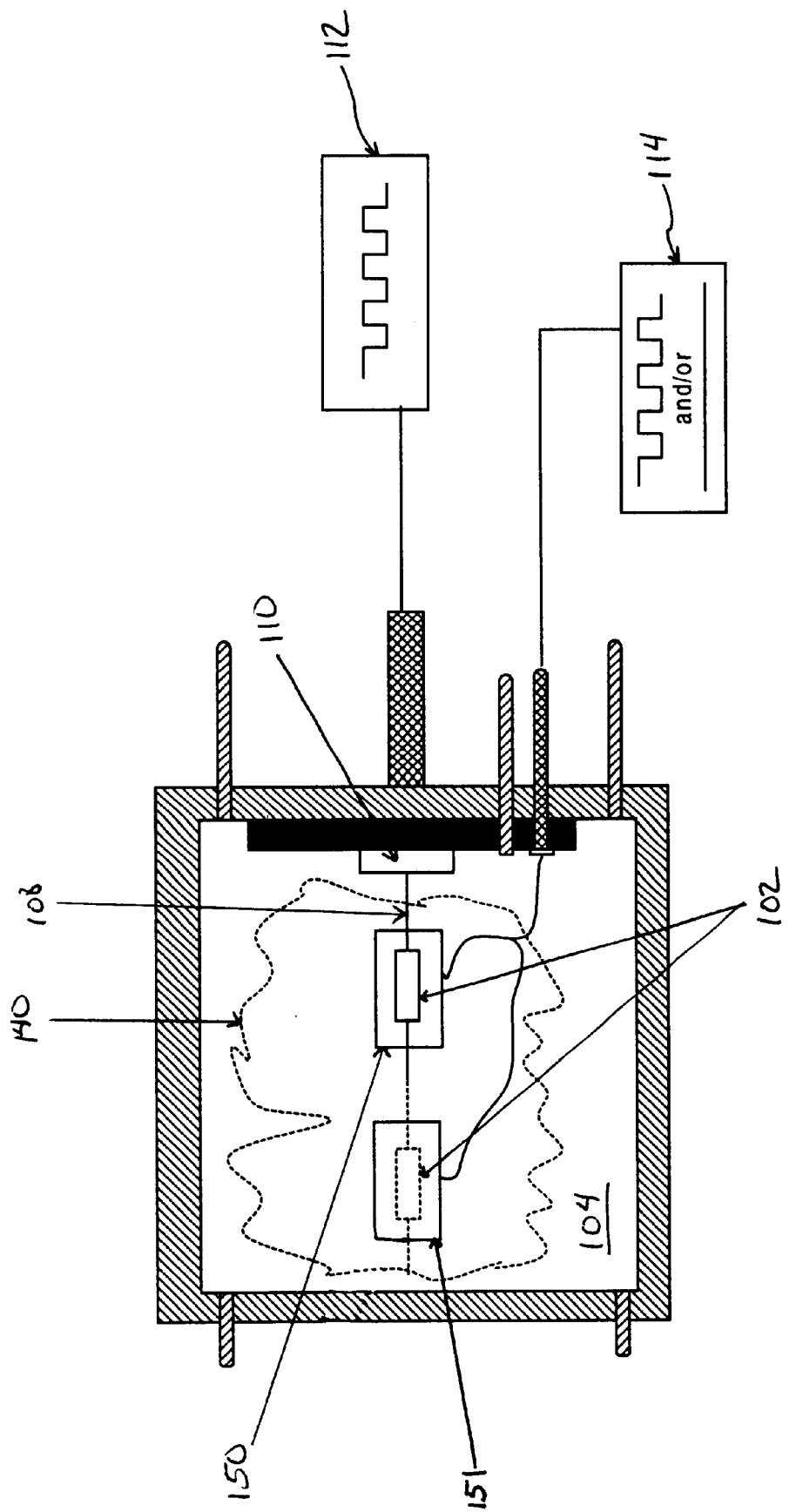
FIG. 4 is a cross-sectional view of the plasma implantation, deposition, and/or mixing chamber.

FIG. 4 is a cross-sectional view of another embodiment of the present invention. This embodiment is particularly adapted for sputter depositing and mixing various metals, radio-absorbent materials, and/or radioactive isotopes onto and into a surface (or surfaces) of a target 102, such as a stent or a catheter. In the medical field, clinicians desire to use stents having thin struts because studies have indicated that stents having thinner struts have lower restenosis rates compared to stents having thicker struts. However, it is difficult to position and/or locate thin strut stents using current angiographic fluoroscopes unless the radiopacity of the stent is increased by incorporating a radio-absorbent or radio-opaque material in the material comprising the stent. Embodiments of the present invention enhance radiopacity of thin strut stents by implanting radio-absorbent elements (e.g. gold) into the struts using plasma recoil ion implantation technology.

In one embodiment, the selected (radio-opaque) elements (ion molecules) are prepared in liquid solution and then coated onto a surface or surfaces of a stent by dip coating, brush painting, electroplating, etc. In this manner, the entire surface, one side, one end, both ends, or any desired part of the stent may be coated. Generally, the biocompatible, radio-opaque, and/or radioactive materials are used to coat the stent (or housings thereof).

In preparation for implantation or deposition, the coated stent(s) are loaded onto a conductive holding device (such as, a mandrel 108) and positioned within reaction chamber 104. A plasma 140, represented by an asymmetric dashed outline within chamber 104, is generated within chamber 104 using techniques and methods previously described. Voltage source 114 superimposes a direct current (DC) sputtering voltage of approximately 500 V to about 2000V onto an independently-variable biasing voltage applied to grid 150 to sputter the grid's material onto a surface (or surfaces) of target 102. In another embodiment, a third voltage source (not shown) may be used to apply the direct current sputtering voltage to grid 150. In one embodiment, sputtering grid 150 may be perforated.

Voltage source 112 applies negative voltage pulses of approximately 60 KV via electrode 110 to target 102 to mix or implant the sputter-deposited material with or into the target matrix. A high voltage pulsing control (not shown) ensures that sputter-deposited atomic species adhere well to target 102 and that gradual interfaces are formed between sputter-deposited layers. Gradual interfaces are desired over sharp interfaces because sharp interfaces can cause cracking and delamination to occur. After processing, target 102 may be removed from chamber 104 or positioned within another sputter-depositing grid 150 for further processing. Plasma ion implantation eliminates concerns associated with cracking layers and biocompatibility because plasma ions accelerated toward the stent drive sputter-deposited molecules into the sub-surface(s) of the stent.

In other embodiments of the invention, a stent (or housing thereof) can be uniformly coated with a desired material using a perforated sputtering grid 150, as shown in FIG. 4. Multiple perforated sputtering grids can be used within the same reaction chamber 104 to uniformly coat a target 102 with multiple materials, as shown in FIG. 4. For example, a target 102 can be placed within perforated sputtering grid 150, which may be formed of gold, stainless steel, titanium, or similar materials. In the presence of a plasma 140, which is formed within chamber 104, voltage source 114, or a third voltage source (not shown) superimposes a DC voltage of up to approximately 2000V on an independently variable biasing voltage applied to grid 150. The application of this DC bias sputters a very thin layer (approximately a couple of nanometers or 100 angstroms thick) of gold (or other) atomic species onto a surface or surfaces of target 102. At the same time (or after the DC bias is switched off), negative voltage of approximately 50 KV to approximately 60 KV is applied to target 102 to implant the sputter-deposited gold (or other atomic material) into a surface or surfaces of target 102. Negative voltage of approximately 5 KV to about –10 KV is used to mix source ions with a surface or surfaces of target 102, which creates a smooth gold surface. Once a smooth surface has been established, additional layers may be sputter-deposited onto target 102, and the process repeated until a desired thickness is reached.

Once a desired thickness is achieved, a second material may be sputter-deposited on top of the first by positioning target 102 within a second sputtering grid 151 and repeating the process described above. The second sputtering material may comprise stainless steel or other similar material.

Exemplary materials that can be used to manufacture sputtering grids include, but are not limited to: radio-absorbent elements such as gold, platinum, silver, or similar materials; radioactive isotopes that may be alpha, beta, or gamma emitters; pure metals, metal alloys, metal compounds, combinations of pure metals, metal alloys, and metal compounds, and similar materials. Similarly, the illustrative types of gaseous media that can be used for sputter-depositing, implantation, and deposition processes include, but are not limited to: argon, chlorine, oxygen, fluorine, nitrogen tetra fluoride, and similar gaseous media.

In various embodiments of the present invention, one or more sputter-depositing grids can be positioned within a reaction chamber or chambers. For example, another sputter-depositing embodiment of the invention includes multiple separate processing chambers, each chamber having at least two sputtering grids.

Figure 5:
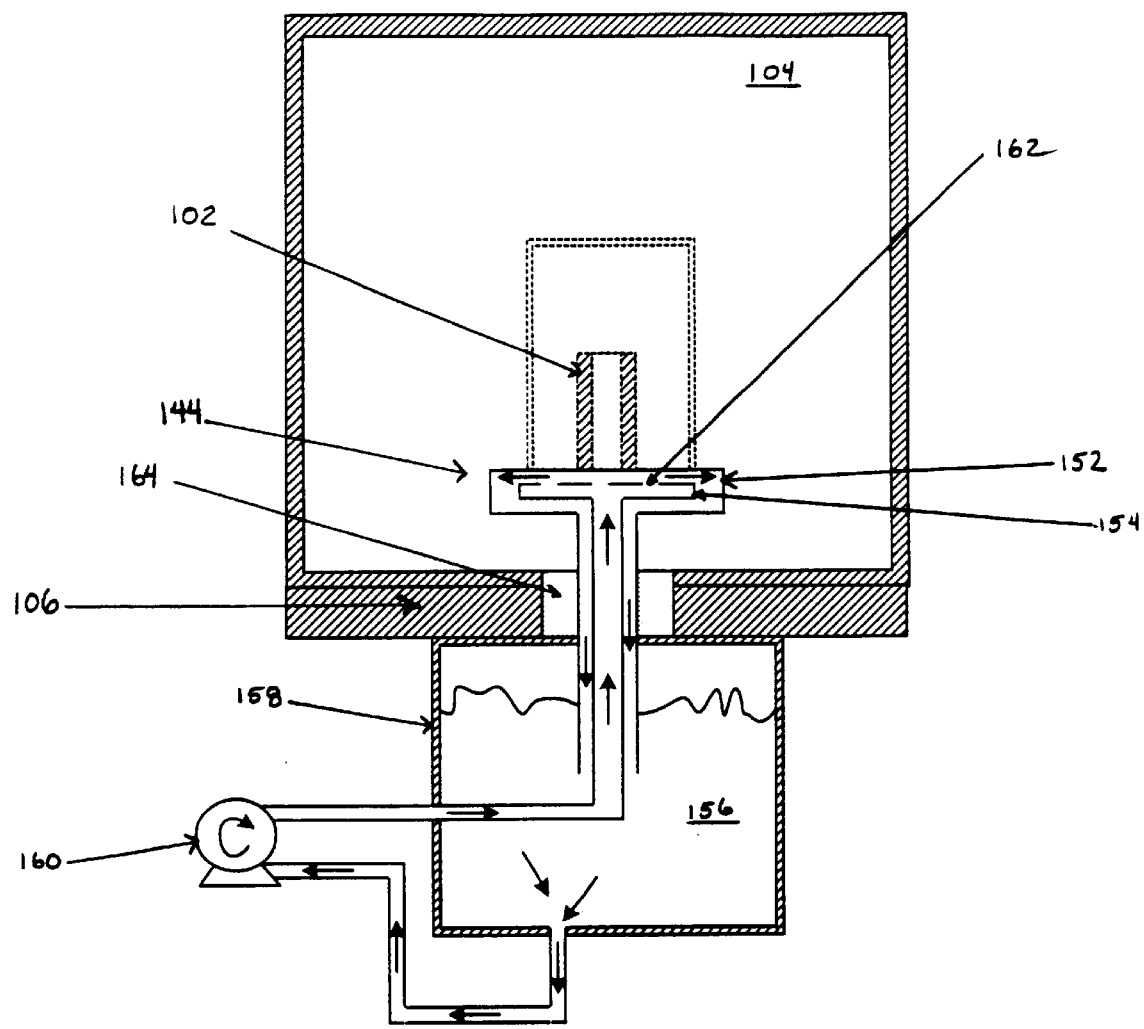
FIG. 5 is a cross-sectional view of a target stage.

FIG. 5 demonstrates how a target stage 144 may be cooled to prevent a target from overheating. In some embodiments of the invention, target 102 is subjected to high temperatures during processing, and it is desirable to prevent target 102 from melting or being damaged by heat. Consequently, the invention provides a means for cooling target stage 144 during processing to ensure that the temperature of target 102 does not exceed a pre-determined threshold temperature. A threshold temperature is a temperature that varies for each target at which a material loses the properties that make it useful for its intended purpose. For example, metallic intra-luminal devices such as stainless steel stents have a threshold temperature of approximately 350° C. The threshold temperature of polymeric materials is approximately 100°C. Biocompatible materials such as polyethelyene terphthalate (PET) and polytetrafluoroethylene (PIFE) generally require temperatures ranging from approximately ambient to about 30° C. The threshold temperature varies for each type of material or combination of materials selected, and the threshold temperature for a given material can be determined using well-known methods and procedures without undue experimentation.

Referring again to FIG. 5, stage 144 is shown positioned within a reaction chamber 104, which includes a base 106, has an exterior housing 152 and an interior housing 154. Both exterior and interior housings may be made of like materials, such as ceramics, metals, or metal alloys. A ceramic stage is typically used in microwave embodiments. A stainless steel stage is typically used in filament or radio-frequency embodiments. In some embodiments of stage 144, its exterior and interior housings may comprise different materials. For example, outer housing 152 may be ceramic while inner housing 154 is stainless steel, or vice versa. Alternatively, outer housing 152 may be stainless steel while inner housing 154 is copper, or vice versa. Outer housing 152 may also be coated with a biocompatible material.

In the embodiment illustratively depicted in FIG. 5, a target 102, coupled to an electrode (not shown), is mounted on stage 144. Coolant 156 from container 158 is pumped by pump 160 through at least one orifice 162 located near or in one end of interior housing 154. Pump 160 is coupled to one end of interior housing 154 and to container 158. Any suitable fluid material may be utilized for cooling, including oils, aqueous solutions, polymers, and gases. Examples of suitable fluid materials include, but are not limited to: water, synthetic oil, freon, helium, and similar materials. An insulating material 164 separates outer housing 152 from the base 106 of reaction chamber 104. In the described embodiment, a top housing of exterior housing 152 coaxially encloses a top housing of inner housing 154, and protrudes through base 106 into the interior of container 158, which is illustratively shown in FIG. 5 as being attached to the exterior surface of base 106. Alternatively, container 158 can simply be operatively attached to stage 144, as for example, by a flexible tube (not shown).

It is to be noted that the present invention provides one or more benefits over the prior art. Some of these advantages include uniform deposition or implantation of ions in three dimensions, a lessening of the dangers associated with arcing, and a method to prevent a target object from overheating during processing.

The above invention has been described with reference to various embodiments. It is understood that variations and modifications can be effected within the spirit and scope of the invention as described hereinabove and as defined in the claims. Accordingly, it is desired that the above specification not limit the present invention, but that the invention be defined with reference to the following claims.

What is claimed is:

1. A plasma ion surface modification apparatus, the apparatus comprising:

a reaction vessel having a reaction chamber, said chamber having a base and being coupled with a plasma source;

an electrode centrally positioned on said base within said chamber; and a perforated grid positioned within said chamber, said grid enclosing a target zone, wherein a separate and independently variable biasing voltage is concurrently applied to each of said grid and said electrode, and wherein said grid biasing voltage is about 50% to 99% less than said electrode biasing voltage.

2. The apparatus of claim 1, wherein said electrode biasing voltage is a square wave, and wherein said grid biasing voltage is one of a square wave or a direct current.

3. The apparatus of claim 2, wherein a square waveform applied to said perforated grid synchronizes with or overlaps a square waveform applied to said electrode.

4. The apparatus of claim 1, further comprising: a sputtering voltage applied to said grid to sputter a desired material onto a target device, said sputtering voltage superimposed on said biasing voltage applied to said grid.

5. The apparatus of claim 4, wherein said sputtering voltage is a direct current (DC) of up to approximately 1000V.

6. A plasma ion surface modification apparatus, the apparatus comprising:

a reaction vessel having a reaction chamber, said chamber having a base and being coupled with a plasma source;

an electrode centrally positioned on said base within said chamber;

a perforated grid positioned within said chamber, said grid enclosing a target zone; and means to apply a biasing voltage to each of said grid and said electrode comprising a voltage source operatively associated with said electrode and with said perforated grid, said means coupled with each of said grid and said electrode, wherein said voltage source includes a voltage divider to apply a first voltage to said electrode and a second voltage to said perforated grid, and wherein said second voltage is about 50% to about 99% less than said first voltage.

7. A plasma ion surface modification apparatus, the apparatus comprising:

a reaction vessel having a reaction chamber, said chamber having a base and being coupled with a plasma source;

an electrode centrally positioned on said base within said chamber;

a perforated grid positioned within said chamber, said grid enclosing a target zone; and means to apply a biasing voltage to each of said grid and said electrode comprising a voltage source operatively associated with said electrode and with said perforated grid, said means coupled with each of said grid and said electrode, wherein said means to apply a biasing voltage to each of said perforated grid and said electrode comprises:

a first voltage source operatively associated with said electrode to provide an electrode voltage; and a second voltage source operatively associated with said perforated grid to provide a grid voltage, and wherein said grid voltage is about 50% to about 99% less than said electrode voltage.

8. A method to protect a target from arcing, the method comprising:

coupling a first voltage source with a grid positioned within a plasma implantation chamber;

coupling a second voltage source with an electrode positioned within said plasma implantation chamber; and operating said voltage sources to apply a first independently-variable biasing voltage to said electrode, and to concurrently apply a second independently-variable biasing voltage to said grid, said second biasing voltage being about 50% to about 99% less than said first biasing voltage.

9. The method of claim 8, wherein said perforated grid is cylindrical.

10. The method of claim 8, wherein said target is a stent or a catheter.

11. The method of claim 8, wherein a surface of said target is modified to comprise a biocompatible material.

12. The method of claim 8 wherein a surface of said target is modified to comprise one of a radio-absorbent material or a radioactive material.

13. The method of claim 12, wherein said radioactive material is selected from the group consisting of: tin (P-32), potassium (K-40), and phosphine (P-32).

14. The method of claim 8, further comprising: positioning a cooling device within said chamber to cool a target positioned within said target zone.

15. The method of claim 14, wherein said cooling device includes: an inner target stage, said inner target stage having at least one aperture therein through which a coolant can pass; an outer target stage surrounding said inner target stage; a reservoir to store the coolant; and a pump operatively coupled with said inner target stage and said reservoir to pump coolant from said reservoir through said inner target stage.

16. The method of claim 15, wherein said coolant is one of a liquid or a gas.

17. The method of claim 8, wherein said first biasing voltage is a pulsed voltage and said second biasing voltage is one of a pulsed voltage or a direct current.

18. The method of claim 17, wherein said voltage source pulses said first biasing voltage synchronously with said second biasing voltage.

19. The method of claim 17, wherein said voltage source overlaps said first pulsed biasing voltage and said second pulsed biasing voltage.

* * * * *